(12) United States Patent
Shiki

(10) Patent No.: US 7,652,356 B2
(45) Date of Patent: Jan. 26, 2010

(54) TAPE CARRIER, TAPE CARRIER FOR LIQUID CRYSTAL DISPLAY DEVICE, AND LIQUID CRYSTAL DISPLAY DEVICE

(75) Inventor: Tatsuya Shiki, Kawasaki (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 181 days.

(21) Appl. No.: 11/882,517

(22) Filed: Aug. 2, 2007

(65) Prior Publication Data
US 2008/0043195 A1 Feb. 21, 2008

(30) Foreign Application Priority Data
Aug. 18, 2006 (JP) .............................. 2006-223596

(51) Int. Cl.
*H01L 23/495* (2006.01)
(52) U.S. Cl. .................... 257/666; 257/668; 257/787
(58) Field of Classification Search ................. 257/668, 257/787, 666, 773; 349/151
See application file for complete search history.

(56) References Cited

U.S. PATENT DOCUMENTS 5,572,346 A * 11/1996 Sakamoto et al. ........... 349/150
6,066,888 A * 5/2000 Yanagisawa ................ 257/668
2007/0117415 A1 * 5/2007 Shikina ........................ 439/55

FOREIGN PATENT DOCUMENTS

| JP | 6-301047 | 10/1994 |
| JP | 8-160446 | 6/1996 |
| JP | 11-204588 | 7/1999 |
| JP | 2002-124544 | 4/2002 |

* cited by examiner

*Primary Examiner*—S. V. Clark
(74) *Attorney, Agent, or Firm*—Young & Thompson

(57) ABSTRACT

To provide a tape carrier capable of suppressing the formation of wrinkles at a non-continuous portion of strength of the tape carrier and avoid the signal line breakage associated with bending operation. A driver IC is mounted on an insulation film tape, input terminal is arranged at one end and an output terminal is arranged at the other end of the insulation film tape, input signal lines and output signal lines are individually mounted between the driver IC and each terminal, and a resin applying region is arranged at a mounting portion of the driver IC. An independent dummy pattern without connecting destination to be electrically connected to is arranged near each end on the side not facing each terminal of the driver IC on the insulation film tape, and the respective end on the driver IC side of each dummy pattern is extended into the resin applying region.

13 Claims, 7 Drawing Sheets

TAPE CARRIER, TAPE CARRIER FOR LIQUID CRYSTAL DISPLAY DEVICE, AND LIQUID CRYSTAL DISPLAY DEVICE

BACKGROUND OF THE INVENTION

This application is based upon and claims the benefit of priority from Japanese patent application No. 2006-223596, filed on Aug. 18, 2006, the disclosure of which is incorporated herein in its entirety by reference.

The present invention relates to tape carriers, tape carriers for liquid crystal display devices, and liquid crystal display devices, in particular, to a tape carrier, a tape carrier for liquid crystal display device, and a liquid crystal display device in which breakage of signal lines is prevented and durability is enhanced.

In the tape carrier with a configuration in which a driver IC is resin sealed on the tape carrier and the length between an input terminal and an output terminal is short, for example, when the connection between a glass substrate on the liquid crystal display side and a circuit substrate on the drive circuit side is a planar connecting state, a phenomenon occurs in which wrinkles form in the tape carrier when returning from high temperature to normal temperature due to the difference in expansion coefficients caused by heat of when the glass substrate and the circuit substrate are connected.

When ambient temperature changes with the wrinkles formed, the signal lines may break due to such wrinkles. In this case, the accident of signal line breakage, in particular, is known to occur frequently at the edge portion of a resin applying region for resin sealing the driver IC near the ends in the longitudinal direction of the driver IC (i.e., region of both ends shifted from the signal line group of input signal lines and output signal lines on the tape carrier), that is, near the boundary of the portion applied with resin and the portion not applied with resin.

As related arts generally known for preventing breakage of signal lines on the tape carrier include the followings.

Japanese Laid-Open Patent Publication No. 2002-124544 (Patent document 1) relates to preventing breakage of a terminal for connecting the driver IC and the tape carrier, that is, an inner lead terminal, and relates to preventing breakage at solder resist edge of the inner lead caused by the difference in expansion coefficients of the materials of the tape carrier. In this case, the inner lead is a distal end portion of the signal line connecting with the terminal of the driver IC, such portion being the portion of the signal line arranged in the vicinity of the driver IC and not covered with the solder resist, and the configuration thereof is disclosed in patent document 1 as the signal line arranged in the resin applying region.

In the liquid crystal display device in which an LCD (Liquid Crystal Display) panel and a circuit substrate are connected by way of a TCP (Tape Carrier Package) serving as a driver IC arranged on a base film, the circuit substrate is supported with the TCP bent downward during transportation. In this case, a phenomenon in which a predetermined region of the TCP repetitively is twisted by the floating of the circuit substrate occurs.

In response to such situation, Japanese Laid-Open Patent Publication No. 11-204588 (patent document 2) discloses a configuration including a reinforcement device for preventing disconnection in a predetermined region at both ends of the base film, so that the input/output lead wires at both ends in the width direction of the TCP are prevented in advance from breaking (disconnecting) over time. The reinforcement device is configured with at least two or more common signal leads and a dummy lead connected to each other in the width direction of the base film, or with such common signal leads and dummy lead coupled together. In this case, the region of the reinforcement device is between the bent portion of the base film that is bent in correspondence to the edge of the LCD panel and the input/output lead, or between the bent portion and the driver IC. That is, patent document 2 discloses an example of a technique for preventing breakage related to the input/output lead.

In press working the tape carrier, distortion from bend or tension is generated by the gap formed between a die and the base film, which may deform or break the tape carrier. In view of such issue, Japanese Laid-Open Patent Publication No. 08-160446 (patent document 3) discloses a configuration in which a conductor is arranged on both sides in the extending direction of a conductor pattern, where a dummy conductor pattern with the same thickness as such pattern is arranged. That is, patent document 3 discloses an example of a technique for preventing deformation and breakage of the tape carrier.

Japanese Laid-Open Patent Publication No. 06-301047 (Patent document 4) discloses a tape carrier with a slit formed in the tape carrier body and a bendable configuration, where an electrically isolated dummy pattern is arranged extending parallel to the signal line group while covering a longitudinal end of the slit and the base film at the periphery of such end on the outer side of the signal line groups so that the signal lines at the slit portion does not break by the bending stress when the signal line group output from the driver IC is bent at the slit (without lining) portion into a substantially U-shape. That is, patent document 4 discloses an example of a technique for preventing breakage of the slit portion without lining (i.e., with base film cut).

However, disclosure on countermeasures for breakage of wiring pattern that occurs at the edge of the resin applying region, which is being addressed in the present invention, is not made in the techniques disclosed in the patent documents described above. The breakage of the pattern that occurs at the edge of the resin applying region which is a problem will be described with reference to the drawings.

FIG. 5A shows a tape carrier, which is a main component of a tape carrier package for liquid crystal display device. The tape carrier (also referred to as "TAB tape") 100 is configured by an insulation film tape 101, which is a base film; input signal lines 106 and output signal lines 107 wired on the insulation film tape 101; a driver IC 102; a resin applying region 105 of resin filled at a portion on which the driver IC 102 is mounted; and an input terminal 103 and an output terminal 104.

The tape carrier 100 connected to a glass substrate 202 and a circuit substrate 201 is shown in FIG. 5B. A conductor surface of the tape carrier 100 shown in FIG. 5B is on the back side of the figure.

In FIG. 5B, when the length between the input terminal 103 and the output terminal 104 of the tape carrier 100 is short, wrinkles 110 is formed in the tape carrier 100 positioned at an intermediate position of the glass substrate 202 and the circuit substrate 201 due to the difference in expansion coefficients of each member after the glass substrate 202 and the circuit substrate 201 are connected, or wrinkles 110 is formed in the tape carrier 100 by positional shift which is occurred when the glass substrate 202, the circuit substrate 201, and the tape carrier 100 are assembled to the liquid crystal display device.

Such wrinkles 110 tend to be concentrated at non-continuous portion of strength of the tape carrier 100. Such non-continuous portion is positioned at the edge portion of the resin applying region 105 (the portion near the boundary of the portion applied with resin and portion not applied with resin, which is the portion where resin is not applied and the strength is weak) where is the position of the outermost signal lines of the signal line group of the input signal lines 106 and the output signal lines 107. That is, the non-continuous portion is positioned at both edges of the input signal lines 106 and the output signal lines 107, and corresponding to the boundary region 109 at both edges of the input signal lines 106 and the output signal lines 107.

When stress changes due to mechanical impact or change in ambient temperature in such state, bending movement occurs at the portion of wrinkles 110, and cracks are caused by such bending at the edge portion of the resin applying region 105, which is the non-continuous point of strength of the tape, and at the portion of the signal lines at both edges of the input signal lines 106 and at both edges of the output signal lines 107 (e.g., signal lines wired in the boundary region 109 shown in FIG. 5B), and the signal lines at the relevant portion breaks finally.

SUMMARY OF THE INVENTION

It is an exemplary object of the present invention to improve such drawbacks and to provide a tape carrier, a liquid crystal display device tape carrier and a liquid crystal display device with enhanced durability that effectively suppresses the formation of wrinkles especially at the portion where the strength of the tape carrier is not continuous, and effectively avoids the occurrence of breakage accident by bending of the signal lines arranged at the relevant region.

In order to achieve the above exemplary object, the taper carrier according to an exemplary aspect of the present invention includes a base film mounted with an IC; an input terminal and an output terminal arranged on opposite sides of the base film with the IC sandwiched in between; input signal lines and output signal lines arranged between the IC and the input terminal and the output terminal, respectively; resin for resin sealing the IC; and a dummy pattern; wherein the dummy pattern is formed traversing the edge of the resin in a region not interfering with the input signal lines and the output signal lines.

As an exemplary advantage according to the invention, the rigidity and the elasticity of the base film portion are increased, formation of wrinkles is effectively avoided, and breaking of the wiring pattern that occurs at the edge of the resin applying region can be effectively prevented.

BRIEF DESCRIPTION OF THE DRAWINGS

The invention, together with objects and advantages thereof, may best be understood by reference to the following description of the presently preferred exemplary embodiment together with the accompanying drawings in which:

FIG. 5 is a view showing a configuration example of a tape carrier package of the related art, where

DETAILED DESCRIPTION OF THE EXEMPLARY EMBODIMENTS

The first exemplary embodiment of the present invention will now be described based on FIGS. 1A and 1B.

First Exemplary Embodiment

Figure 1A:
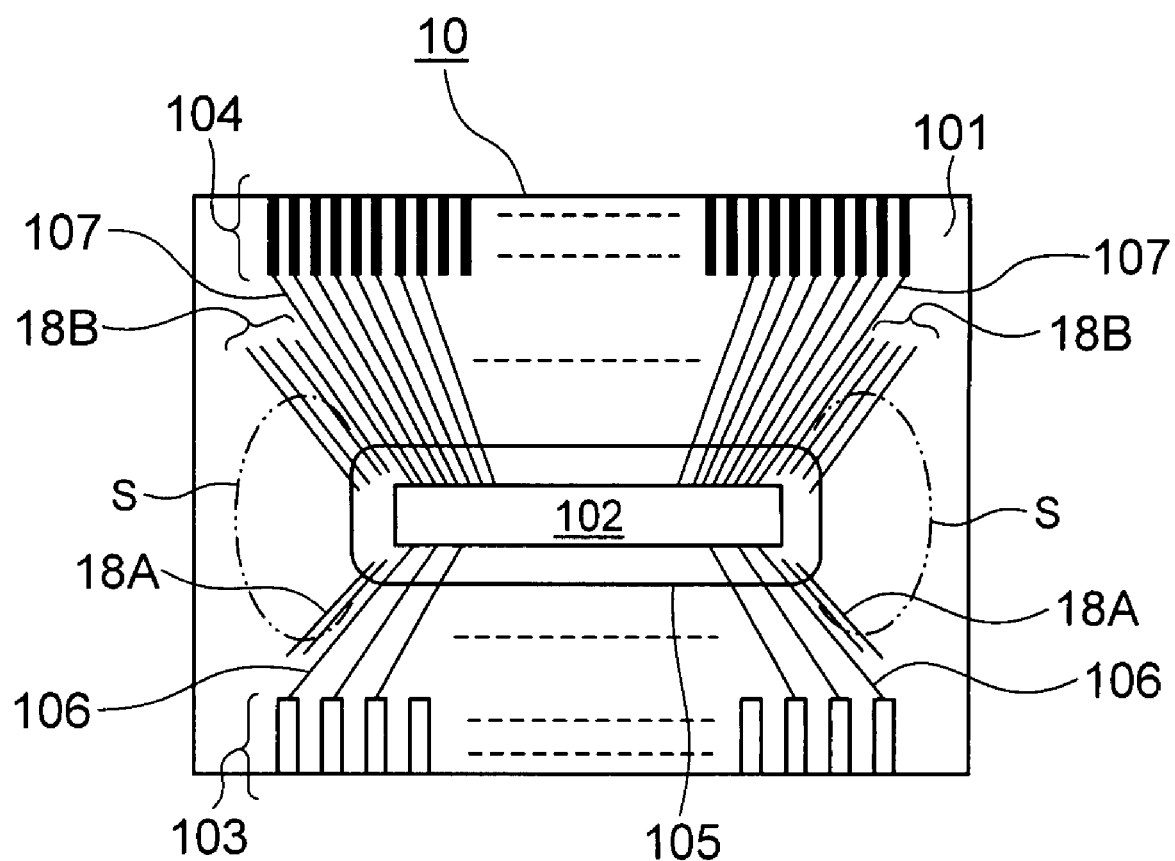
FIG. 1A is a plan view showing a schematic configuration of a tape carrier according to a first exemplary embodiment of the present invention.
Figure 1B:
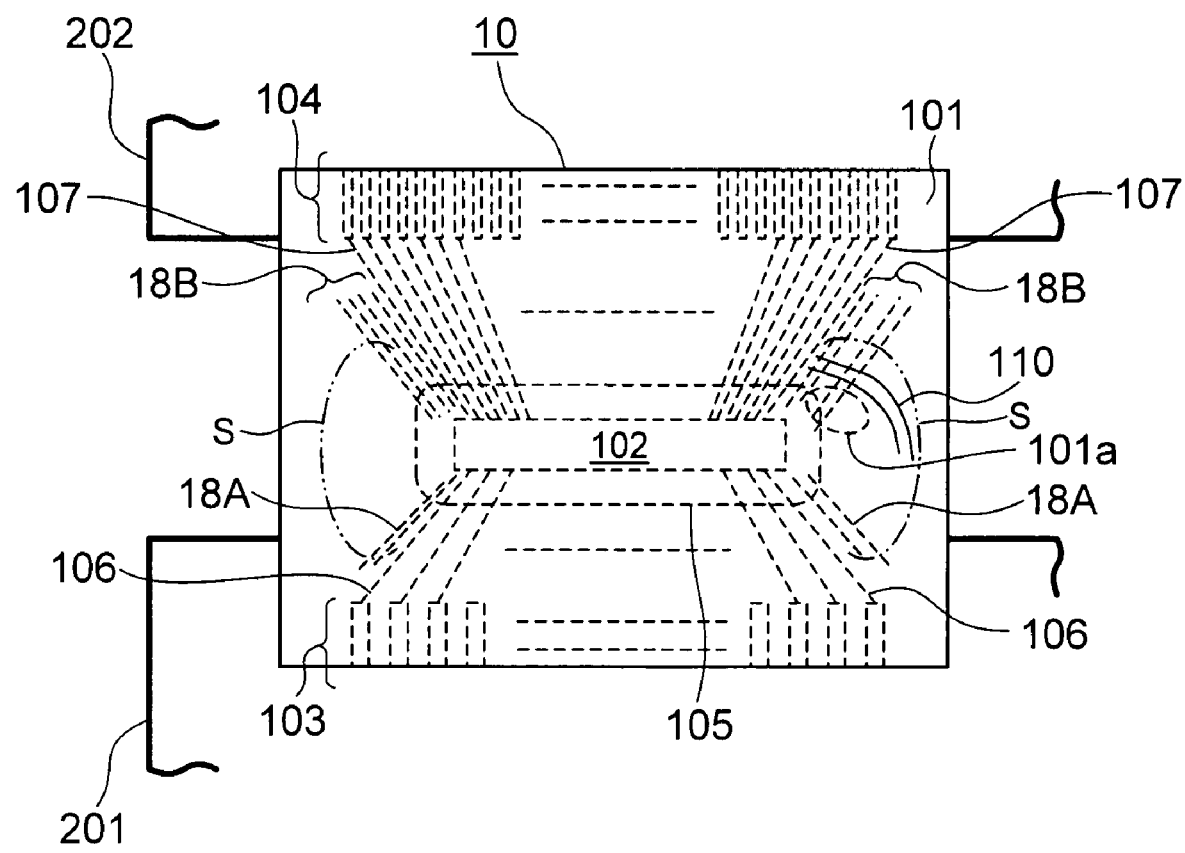
FIG. 1B is an explanatory view showing a schematic configuration of the tape carrier according to the first exemplary embodiment of the present invention, showing a case where the tape carrier is interposed between a glass substrate and a circuit substrate of a liquid crystal display device.

FIGS. 1A and 1B show a tape carrier for liquid crystal drive serving as the tape carrier of the first exemplary embodiment. Same reference numerals are denoted for components same as in. 5 described above.

(Configuration)

As shown in FIG. 1A, the tape carrier 10 of the first exemplary embodiment includes an insulation film tape 101, which is a base film, including an input terminal 103 which includes a plurality of terminals on one end and an output terminal 104 which includes a plurality of terminals on the other end; a driver IC 102 serving as a driving IC for an electronic device (e.g., for liquid crystal display device) mounted at the middle part of the insulation film tape 101; input signal lines 106 for connecting the driver IC 102 and the input terminal 103; and output signal lines 107 for connecting the driver IC 102 and the output terminal 104.

In each free region S corresponding to both left and right side ends of the driver IC 102 in FIG. 1A, linear dummy patterns 18A, 18B are formed close to the outer side line of the input signal lines 106 and the output signal lines 107, respectively. The dummy patterns 18A, 18B are made of material same as the input signal lines 106 and the output signal lines 107.

As shown in FIG. 1, a rectangular shaped driver IC 102 described above is used in the present exemplary embodiment, and the resin is filled to a rectangular shape at the mounting position of the driver IC 102 on the insulation film tape 101. In FIG. 1A, reference numeral 105 indicates a resin applying region of rectangular shape at the mounting position of the driver IC 102.

Figure 1C:
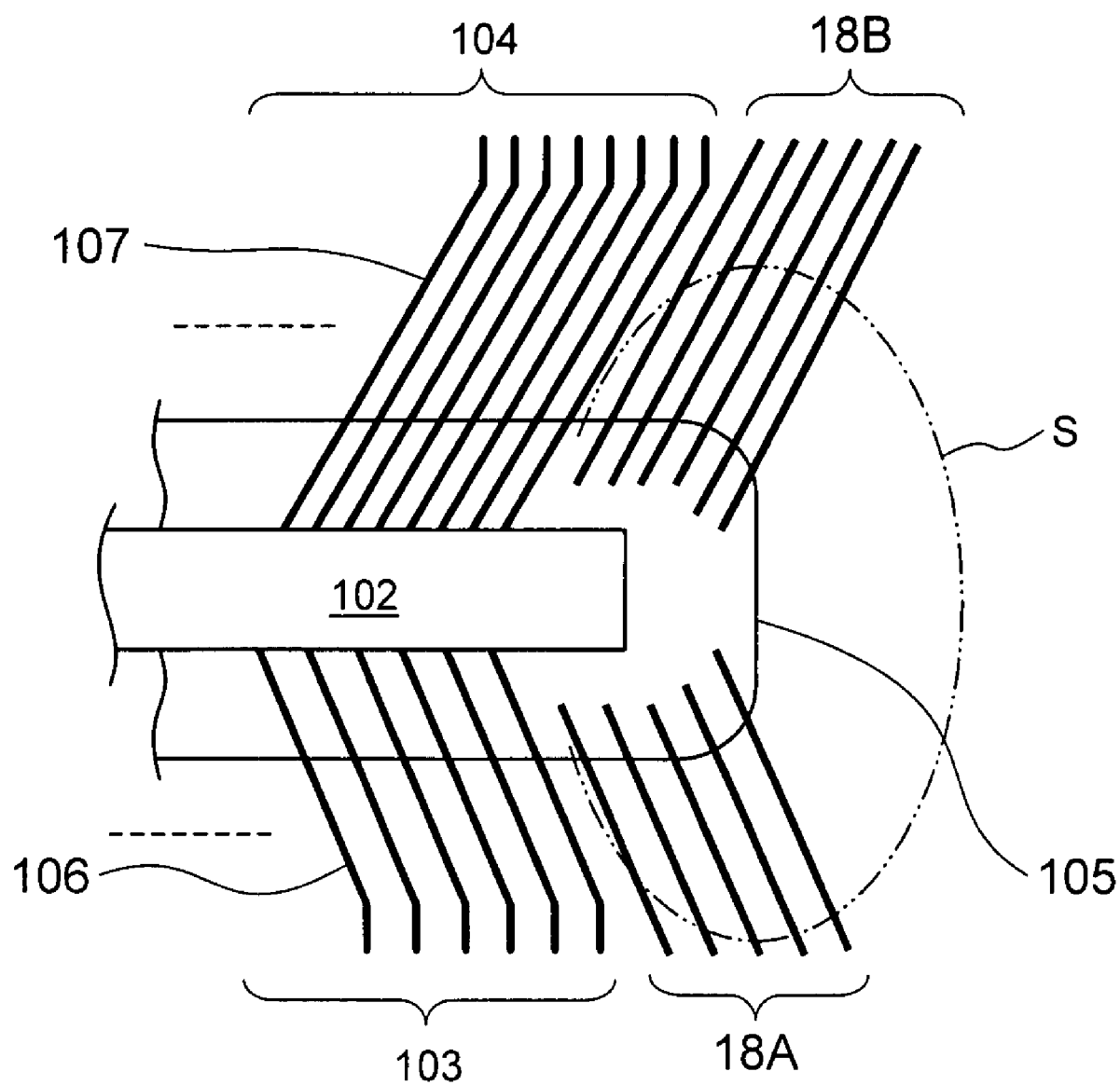
FIG. 1C is a view showing a schematic configuration of the tape carrier according to the first exemplary embodiment of the present invention, showing the periphery of region S of FIG. 1A in an enlarged manner.

The dummy patterns 18A, 18B are independent wirings that do not have a connecting destination to be electrically connected to, as opposed to the input signal lines 106 and the output signal lines 107, and are arranged at a predetermined interval with respect to the signal lines 106 or 107 and along the relevant signal lines 106 or 107, and furthermore, are arranged with the end on the driver IC 102 side extended into the resin applying region 105 (i.e., so as to cover the end edge portion which is the edge of the resin applying region 105). FIG. 1C is an enlarged view of the periphery of the region S of FIG. 1A. Each dummy pattern 18A, 18B is in plurals and is wired substantially parallel to the closest signal line of the input signal lines 106 and the output signal lines 107 (outermost signal line of each signal line group), and the plurality of dummy patterns 18A, 18B is set to have a wiring interval (equal interval) same as the input signal line 106 and the output signal line 107. The dummy patterns 18A, 18B are wired substantially parallel to each signal line and at equal interval to prevent the strength of the tape carrier from suddenly changing at the dummy patterns 18A, 18B.

FIG. 1B shows a state in which the tape carrier 10 described above is mounted between the circuit substrate 201 for transmitting display information and the glass substrate 202 arranged with liquid crystal panel electrodes in the liquid crystal display device (not shown). The conductor surface of the tape carrier 10 shown in FIG. 1B is on the back side of the figure.

In this case, the plurality of input terminals 103 and output terminals 104 is arranged respectively in correspondence to a plurality of connecting terminals of the liquid crystal panel electrode (not shown) arranged on the glass substrate 202 in the liquid crystal display device and the circuit substrate 201 for transmitting display drive information to the liquid crystal panel of the liquid crystal display device so as to have the same terminal interval as such terminal intervals. The output terminal 104 and the input terminal 103 of the tape carrier 10 thus are able to engage with the respective connecting terminal of the liquid crystal panel electrode and the circuit substrate.

The input terminal 103 is connected to the circuit substrate 201 and the output terminal 104 is connected to the glass substrate 202 by an anisotropic conductive film (not shown).

(Description of Operation)

The formation of wrinkles 110 will be described first.

When the length between the input terminal 103 and the output terminal 104 is short in the tape carrier 10, internal distortion force is concentrated at a soft quality region of the tape carrier 10 due to change in ambient temperature caused by the difference in expansion coefficients of the circuit substrate 201 and the glass substrate 202, thereby forming wrinkles 110. The wrinkles 110 are also caused by the positional shift that occurs when mounting the tape carrier 10 to the liquid crystal display device (not shown) after being connected to the circuit substrate 201 and the glass substrate 202.

The wrinkles 110 is formed around the free region S (near both left and right ends of the resin applying region 105 of FIG. 1B) facing both left and right edges of the input signal lines 106 and the output signal lines 107. This is because the boundary with respect to the soft quality region is shifted further to the outer side than the edges of the input signal lines 106 and the output signal lines 107 due to the combination of the insulation film tape 101 and the wiring as described above, where the portion of the boundary region 101a is the non-continuous point of strength of the tape carrier 10 in the present exemplary embodiment.

If internal stress changes by mechanical impact or change in ambient temperature in the above state, bending movement corresponding to the impact or the temperature change occurs at the portion of wrinkles 110 in FIG. 1B. In particular, the edge portion of the resin applying region 105 in the boundary region 101a close to both left and right ends of the resin applying region 105 in FIG. 1B, which is the non-continuous point of tape strength, is affected.

Figure 5A:
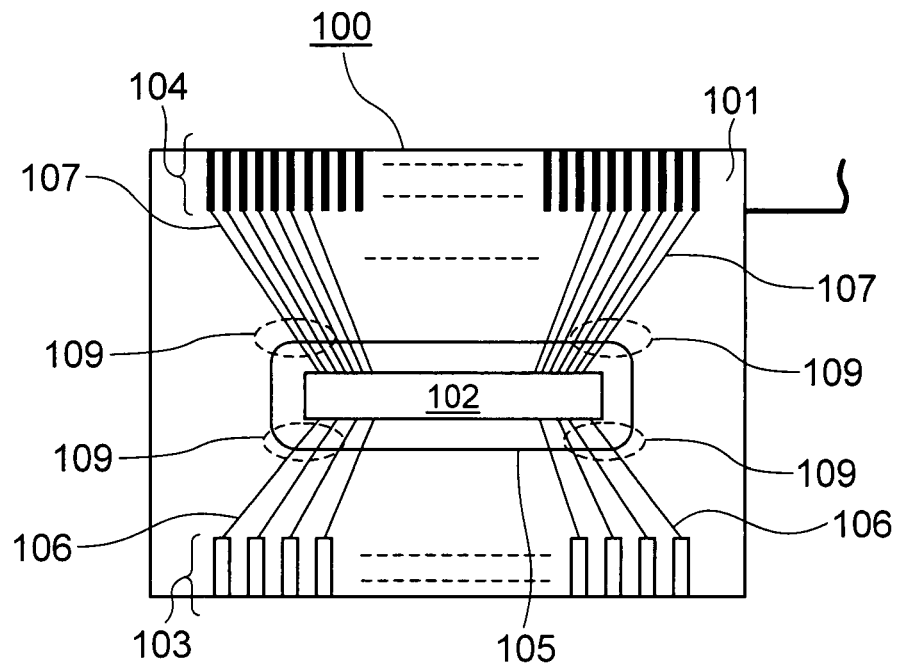
FIG. 5A is a plan view showing a schematic configuration.
Figure 5B:
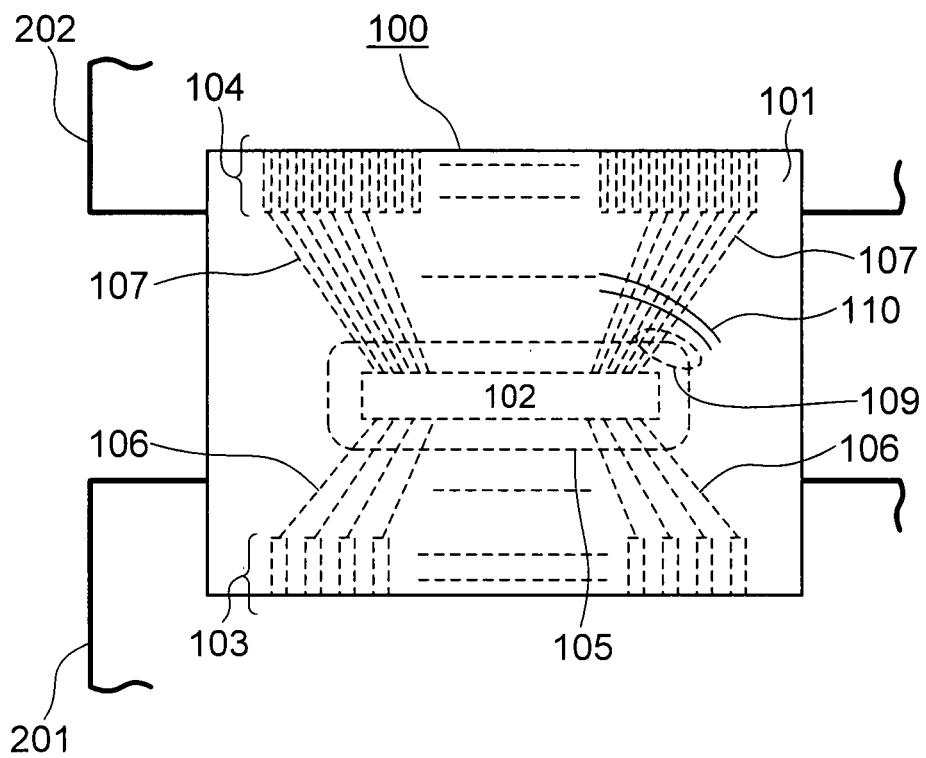
FIG. 5B is an explanatory view showing a case where the tape carrier is arranged between a glass substrate and a circuit substrate of a liquid crystal display device.

In this case, the dummy patterns 18A, 18B have the ends on the side of the resin applying region 105 extending into the resin applying region 105, whereby the rigidity and the elasticity of the edge portion of the resin applying region 105 are enhanced. The formation of wrinkles 110 near the boundary region 109 shown in FIG. 5B is thereby suppressed at the edge portion of the resin applying region 105 where the dummy patterns 18A, 18B are attached.

Therefore, the majority of the lines at both edges of the input signal lines 106 and both edges of the output signal lines 109 arranged on the inner side than the dummy patterns 18A, 18B are in a covered state so as not to be directly influenced by the change (wrinkles) due to the presence of the dummy patterns 18A, 18B. Consequently, the pattern damaging accident of the input signal lines 106 and the output signal lines 107 that conventionally occurred at the edge portion of the resin applying region 105 at where resin is filled to the mounting portion of the driver IC 102 is effectively suppressed in the present exemplary embodiment.

That is, the dummy patterns 18A, 18B are formed in plurals parallel to and at the same wiring interval as the input signal lines 106 on the input side and parallel to and at the same wiring interval as the output signal lines 107 on the output side, whereby formation of wrinkles 110 is suppressed and pattern damaging accident of the input signal lines 106 and the output signal lines 107 is avoided.

According to the exemplary embodiment of the present invention described above, the rigidity and the elasticity of the portion of the base film in the region attached with the dummy pattern are increased since the dummy patterns are arranged on the outer side of the input signal line group and the output signal line group at the periphery of the IC, and furthermore, the rigidity and the elasticity at the edge portion of the resin applying region are increased since the dummy patterns are extended into the inner part of the resin applying region on the IC side, whereby formation of wrinkles associated with the bending movement at locations where wrinkles conventionally occurred is effectively avoided. Therefore, the formation of wrinkles that occurred due to expansion/contraction of the conventional panel display circuit and the circuit substrate and the breakage accident of the input signal lines and the output signal lines at the edge of the resin applying region caused by such wrinkles are effectively prevented in the region attached with the dummy patterns, whereby an excellent tape carrier in which durability is significantly enhanced and the liquid crystal display device are obtained.

Second Exemplary Embodiment

Figure 2:
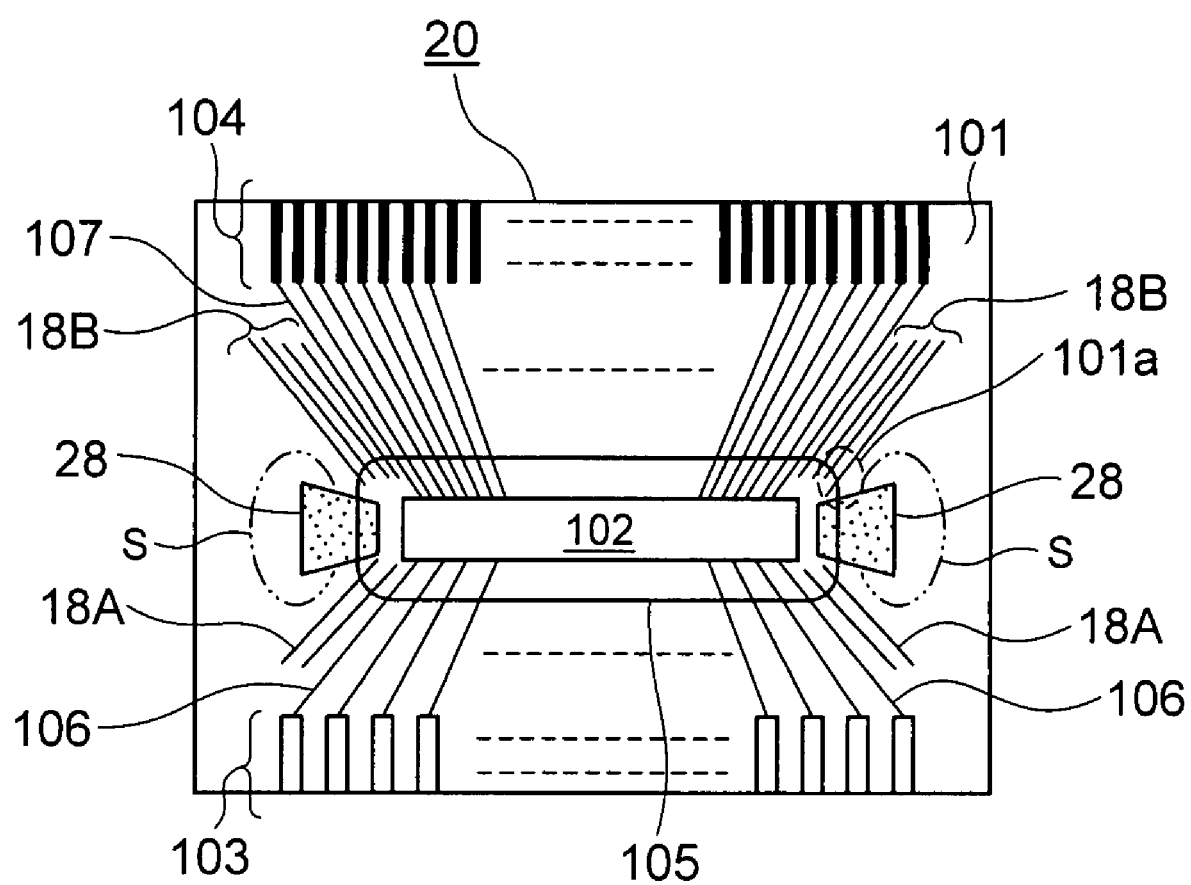
FIG. 2 is a plan view showing a schematic configuration of a tape carrier according to a second exemplary embodiment of the present invention.

In the tape carrier 20 for liquid crystal drive according to the second exemplary embodiment, each constituting members in the first exemplary embodiment (FIGS. 1A, 1B) described above are arranged, as shown in FIG. 2. In the second exemplary embodiment, an independent base shaped dummy pattern 28 that is of a square shape (trapezoid shape) and that does not have a connecting destination to be electrically connected to is arranged in each free region S positioned between the dummy patterns 18A, 18B, described above, on the respective outer sides of the input signal lines 106 and the output signal lines 107. The feature lies in that the end on the driver IC 102 side of the base shaped dummy pattern 28 is extended into the resin applying region 105 described above.

The base shaped dummy pattern 28 has a square shape (trapezoid shape) in the present exemplary embodiment, but in the present invention, the base shaped dummy pattern is not limited to the square shape (trapezoid shape) and may take other shapes.

Although a free region S where stress is concentrated is provided at the portion of the base film on the outer sides of the dummy patterns 18A, 18B in the first exemplary embodiment, the base shaped dummy pattern 28 is arranged in the free region S where stress is concentrated in the second exemplary embodiment.

Thus, the strength of the portion of the free region S on the insulation film tape can be reinforced, the formation of wrinkles 110 at the relevant portion can be effectively suppressed, and pattern breakage at the relevant portion of the input signal lines 106 and the output signal lines 107 can be effectively avoided.

Third Exemplary Embodiment

Figure 3:
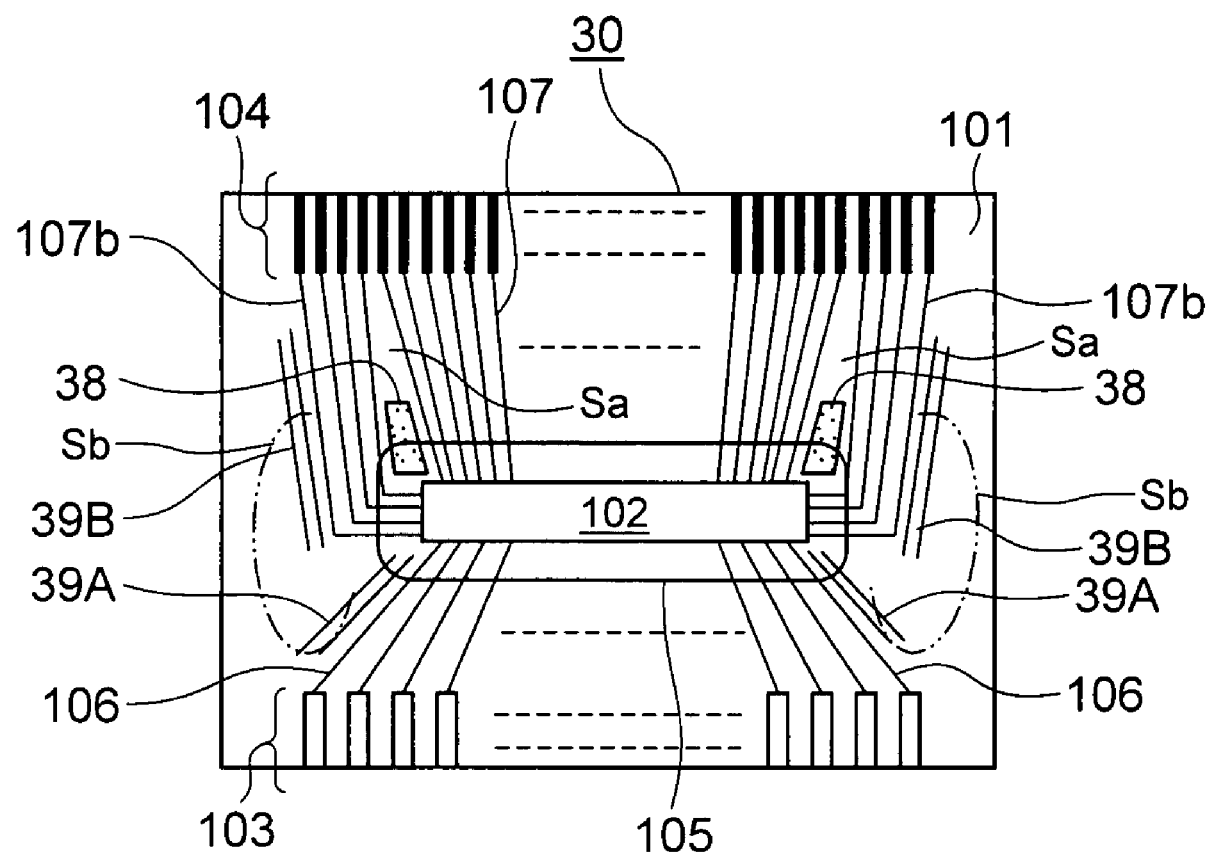
FIG. 3 is a plan view showing a schematic configuration of a tape carrier according to a third exemplary embodiment of the present invention.

As shown in FIG. 3, in the tape carrier 30 for liquid crystal drive in the third exemplary embodiment, the output of the driver IC 102 is also output from the short side of the driver IC 102 with output signal lines 107b. Thus, in the exemplary embodiment of FIG. 3, the output signal lines are arranged divided into a total of three groups of the output signal lines 107 from the central portion and two output signal lines 107b from the side portions.

Among the grouped output signal lines, an independent base shaped dummy pattern 38 of square shape with a narrow width that does not have a connecting destination to be electrically connected to is arranged in a free region Sa (region near dummy pattern 38) between the output signal lines 107 from the central portion and the output signal lines 107b from side portions. The end of each base shaped dummy pattern 38 on the driver IC 102 side is extended into the resin applying region 105. Thus, the rigidity and the elasticity of the base film portion around the edge of the resin applying region 105 in the relevant portion are increased and formation of wrinkles is suppressed, whereby occurrence of breakage accident of the signal lines 106, 107, 107b is effectively suppressed.

Furthermore, independent linear dummy patterns 39A, 39B that do not have a connecting destination to be electrically connected to are arranged along each proximate signal line 106, 107b in a free region Sb positioned on each outer side of the side portions of the three groups of output signal lines and the portion positioned on both outer sides of the input signal lines 106 of the free region Sb, as shown in FIG. 3. In this case, the end of the linear dummy pattern 39A on the driver IC 102 side is extended into the resin applying region 105 described above, similar to the linear dummy pattern 18A described above, and thus the strength of the base film at the relevant portion is reinforced.

The strength of the base film in the free region Sa portion is thus reinforced, discontinuity in the signal line groups between the output signal lines 107, 107b is resolved, and internal stress is prevented from concentrating at the free region Sa.

The dummy pattern 38 above described has a square shape in FIG. 3, but it may be an independent linear dummy pattern that does not have a connecting destination to be electrically connected to and is arranged substantially parallel to the output signal line 107 and at an interval same as each signal line.

Other configurations and the effects thereof are the same as the first exemplary embodiment described above.

Fourth Exemplary Embodiment

Figure 4:
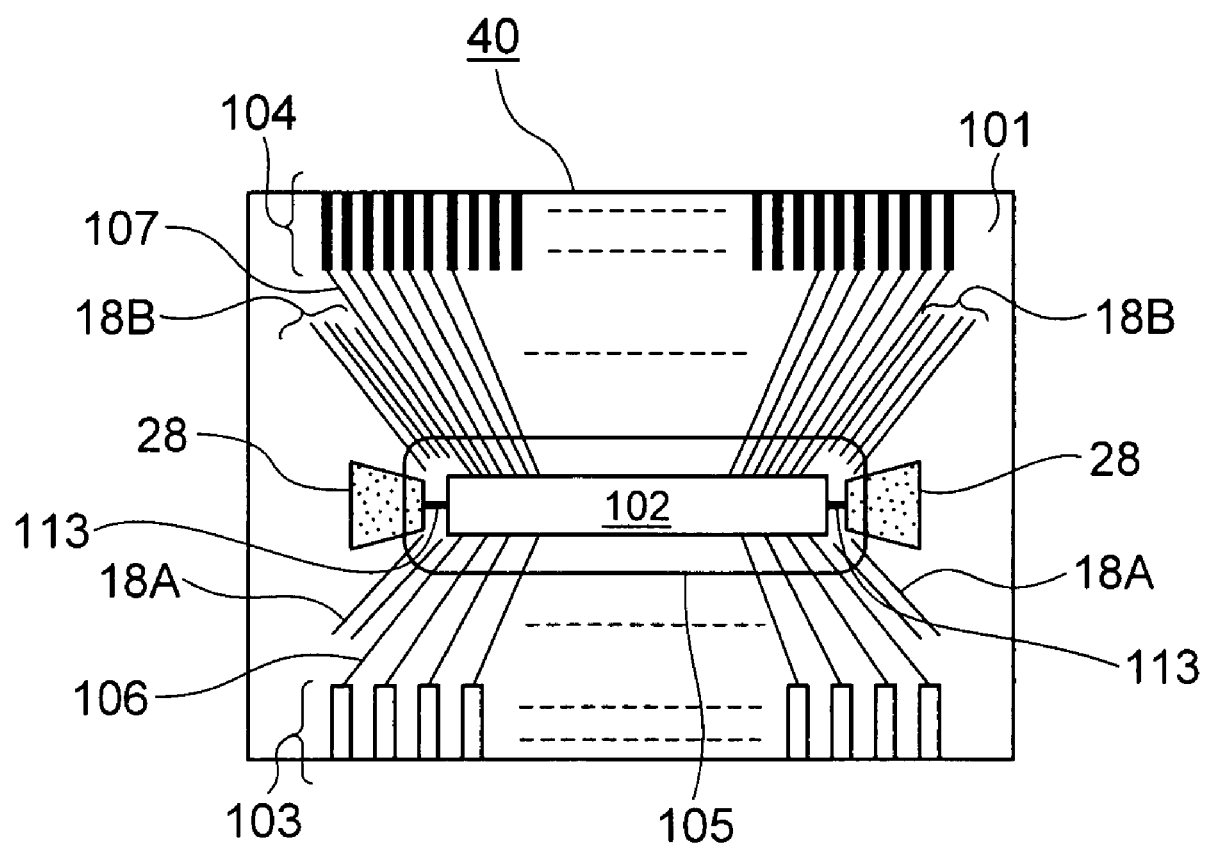
FIG. 4 is a plan view showing a schematic configuration of a tape carrier according to a fourth exemplary embodiment of the present invention.

As shown in FIG. 4, the tape carrier for liquid crystal drive according to the fourth exemplary embodiment has a feature in that the base shaped dummy pattern 28 in the second exemplary embodiment described above is connected to either a ground circuit of the driver IC or a circuit of minimum potential of the driver IC.

FIG. 4 is a view showing a state where the dummy pattern 28 in the second exemplary embodiment (FIG. 2) is connected to the ground circuit of the driver IC (102) using a connection wiring 113 serving as a ground wiring. A heat radiating device of the driver IC (102) is thus ensured by the dummy pattern 28, and is also used as heat countermeasures of the driver IC. In place of the ground wiring, wire connection can be made to the minimum potential to provide the same function as the ground wiring.

Other configurations and effects are the same as the first exemplary embodiment described above.

In the fourth exemplary embodiment, the base shaped dummy pattern 28 in the second exemplary embodiment is given by way of example, which is connected to either the ground circuit of the driver IC or the circuit of minimum potential of the driver IC, but the linear dummy patterns 18A, 18B of the first exemplary embodiment or the base shaped dummy pattern 38 and the linear dummy patterns 39a, 39B of the third exemplary embodiment may be used and connected to either the ground circuit of the driver IC or the circuit of minimum potential of the driver IC.

Therefore, in each of the above exemplary embodiments, the rigidity and the elasticity of the base film portion of the region arranged with the dummy pattern are significantly enhanced since the dummy pattern is arranged on the outer side of the group of input signal lines 106 and the group of output signal lines 107 arranged in correspondence to the driver IC (102) or between the output signal lines 107, 107b, and furthermore, the rigidity and the elasticity of the edge portion of the resin applying region 105 are enhanced since the dummy pattern is extended into the resin applying region 105 on the driver IC side, whereby formation of wrinkles 110 associated with the bending movement of the relevant location where wrinkles conventionally formed is effectively avoided.

Therefore, in the region where the dummy patterns 18A, 18B, 28, 38, 39A, or 39B is arranged, the formation of wrinkles caused by expansion/contraction etc. of the conventional panel display circuit and the circuit substrate is effectively suppressed, and the breakage accident of the input signal lines and the output signal lines at the edge of the resin applying region caused by the wrinkles is effectively prevented, whereby the tape carrier and the tape carrier for liquid crystal display device in which the durability is significantly enhanced are obtained, and moreover, the significant effect in that the durability of the liquid crystal display device equipped with such tape carrier is greatly enhanced is obtained.

Other exemplary embodiments of the present invention will now be described.

The tape carrier according to the present invention relates to a tape carrier in which an insulation film tape is used as a base film; an IC is arranged at the middle part of the base film; a plurality of input terminals for IC is arranged at one end of the base film and a plurality of output terminals for IC is arranged at the other end opposite to the relevant one end; the input signal lines and the output signal lines are individually mounted between the IC and the input terminal, and between the IC and the output terminal, respectively; and a resin applying region is formed by filling resin to the mounting portion of the IC, where linear or base shaped dummy pattern electrically independent from the input terminal and the output terminal is arranged proximate to the side not facing the plurality of input terminals and output terminals of the IC, and the end of each dummy pattern on the IC side is respectively extended into the resin applying region.

Therefore, the rigidity and the elasticity of the base film portion of the region arranged with the dummy pattern are increased since the dummy pattern is arranged on the outer side of the input signal line group and the output signal line group at the periphery of the IC, and furthermore, the rigidity and the elasticity of the edge portion of the resin applying region are increased since the dummy pattern is extended into the resin applying region on the IC side, whereby formation of wrinkles associated with the bending movement of the location where wrinkles conventionally formed is effectively avoided.

The tape carrier according to the present invention relates to a tape carrier in which an insulation film tape is used as a base film; an IC is arranged on the base film; and a plurality of input terminals is arranged at one end of the base film and a plurality of output terminals is arranged at the other end; the input signal line and the output signal line are individually mounted between the IC and the input terminal, and between the IC and the output terminal, respectively; and a resin applying region is formed by filling resin to the mounting portion of the IC; where linear dummy pattern electrically independent from the input terminal and the output terminal is arranged on each outer side of the input signal line and the output signal line on the base film with a predetermined interval from each signal line and along each signal line, and the end of each linear dummy pattern on the IC side is respectively extended into the resin applying region.

In this case as well, the rigidity and the elasticity of the base film portion of the region arranged with the dummy pattern are increased, similar to the case described above, and furthermore, the rigidity and the elasticity of the edge portion of the resin applying region are increased since the dummy pattern is extended into the resin applying region on the IC side, whereby formation of wrinkles associated with the bending movement of the location where wrinkles conventionally formed is effectively avoided.

The linear dummy pattern is formed by a plurality of dummy patterns, and is arranged substantially parallel to the closest signal line of the input signal line and the output signal and at an interval same as each signal line.

Furthermore, the tape carrier according to the present invention relates to a tape carrier in which an insulation film tape is used as a base film; an IC is arranged at the middle part of the base film; a plurality of input terminals is arranged at one end of the base film and a plurality of output terminals is arranged at the other end are arranged; the input signal lines and the output signal lines are individually mounted between the IC and the input terminal, and between the IC and the output terminal, respectively; and a resin applying region is formed by filling resin to the mounting portion of the IC; where a base shaped dummy pattern electrically independent from the input terminal and the output terminal is arranged at each region positioned on each outer side of the input signal line and the output signal line on the base film, and the end of the base shaped dummy pattern on the IC side is respectively extended into the resin applying region.

In this case as well, the rigidity and the elasticity of the base film portion in the region arranged with the base shaped dummy pattern are increased as described above, and furthermore, the rigidity and the elasticity of the edge portion of the resin applying region are increased since the dummy pattern is extended into the resin applying region on the IC side, whereby formation of wrinkles associated with the bending movement of the location where wrinkles conventionally formed can be effectively avoided.

One or more linear dummy patterns electrically independent from the input terminal and the output terminal may be arranged on both sides of the base shaped dummy pattern along each input signal line and output signal line and at a predetermined interval from each signal line, where the end of each linear dummy pattern on the IC side is extended into the resin applying region. The linear dummy pattern may be arranged substantially parallel to the closest signal line of the input signal line and the output signal at the same interval as each signal line.

The increase in the rigidity and the elasticity at the relevant location can be extended to the periphery thereof by arranging the linear dummy pattern on the outer side of each base shaped dummy pattern at where the stress is concentrated, so that formation of wrinkles associated with the bending movement of such location can be more effectively suppressed.

The tape carrier according to the present invention relates to a tape carrier in which an insulation film tape is used as a base film; an IC is arranged at the middle part of the base film; a plurality of input terminals is arranged at one end of the base film and a plurality of output terminals is arranged at the other end; the input signal lines and the output signal lines are individually mounted between the IC and the input terminal, and between the IC and the output terminal, respectively; and a resin applying region is formed by filling resin to the mounting portion of the IC; where the output signal lines are wired from two or more sides of the IC on the base film, a linear or base shaped dummy pattern electrically independent from the input terminal and the output terminal is arranged in each free region provided between the grouped signal line groups, and the end of each dummy pattern on the IC side is extended into the resin applying region. The linear dummy pattern is arranged with a predetermined interval from the input signal line and the output signal line along each signal line.

The strength within the signal line group is reinforced since the dummy pattern is arranged at an arbitrary non-continuous portion of strength of the tape carrier in the region between the output signal line and the output signal line, and furthermore, the rigidity and the elasticity of the base film portion at the boundary region with respect to the resin applying region in the signal line portion are increased, and formation of wrinkles associated with the bending movement is also effectively suppressed even at the relevant location.

The linear dummy pattern described above is configured by a plurality of dummy patterns and is arranged substantially parallel to the closest signal line of the input signal line and the output signal line and at the same interval as each signal line.

The linear dummy pattern electrically independent from the input terminal and the output terminal is arranged along the proximate signal line in the free region positioned on each outer side of the side portions of the output signal lines wired in a divided manner from two or more sides of the IC and the free region positioned on both outer sides of the input signal line. The end on the driver IC side of each linear dummy pattern arranged on both outer sides of the input signal line may be extended into the resin applying region.

Since the linear dummy patterns are arranged on each outer side of the side portions of the signal lines arranged in a divided manner from two or more sides of the IC and each outer side of the input signal, the strength at the relevant location is effectively reinforced.

The linear dummy pattern described above may be configured by a plurality of dummy patterns and arranged substantially parallel to the closest signal line among the input signal line and the output signal line and at the same interval as each signal line.

Each dummy pattern may be connected to the ground wiring of the driver IC or the wiring of equivalent function.

The strength of the region arranged with the dummy pattern is reinforced, and furthermore, it can be used as heat radiating site of the heat of the driver IC itself.

The plurality of output terminals and input terminals described above are arranged at the same terminal interval as the terminal interval of the plurality of connecting terminals of the liquid crystal panel electrode in the liquid crystal display device and the circuit substrate for transmitting display drive information to the liquid crystal panel of the liquid crystal display device, so that the output terminals and the input terminals of the tape carrier can engage each connecting terminal of the liquid crystal panel electrode and the circuit substrate.

Therefore, breakage of the input signal line and the output signal line that occurs at the edge region around the resin applying region due to influence of wrinkles formed by positional shift originating from external vibration etc. in time of mounting or after mounting with respect to the liquid crystal display device can be prevented, and liquid crystal driving tape carrier with enhanced durability can be achieved.

The liquid crystal display device according to the present invention relates to a liquid crystal display device including a glass substrate arranged with a liquid crystal panel and a liquid crystal panel electrode for panel drive, a circuit substrate for transmitting display information to the liquid crystal display, and a tape carrier package including an IC arranged for liquid crystal drive being arranged between each substrates, where the tape carrier described above is used for the tape carrier package, and the tape carrier is connected to the liquid crystal panel electrode and the circuit substrate in such a manner that the output terminal and the input terminal of the tape carrier are connected to each corresponding connecting terminal of the liquid crystal panel electrode and the circuit substrate.

Therefore, breakage of the input signal line and the output signal line that occurs at the edge region around the resin applying region due to influence of wrinkles formed by positional shift originating from external vibration etc. in time of mounting or after mounting with respect to the liquid crystal display device can be prevented, and liquid crystal display device with enhanced durability and reliability can be achieved.

A case where the present invention is applied to the tape carrier for liquid crystal drive in the liquid crystal display device has been described in each of the first to fourth exemplary embodiments, but is not limited to the liquid crystal display device, and the tape carrier mounted with such driver IC is applicable to display devices assembled by connecting the tape carrier mounted with the driver IC to the panel display circuit and the circuit substrate such as PDP (Plasma Display Panel) display device, and organic EL display device. The exemplary embodiments illustrated in the figure are provided to describe a typical example of the present invention and the present invention should not be limited to such exemplary embodiments.

It should be apparent to those skilled in the art that the present invention may be embodied in many other specific forms without departing from the spirit or scope of the invention. Therefore, the present invention is not to be limited to the details given herein, but may be modified within the scope and equivalence of the appended claims.

What is claimed is:

1. A tape carrier comprising:
    a base film mounted with an IC;
    an input terminal and an output terminal arranged on opposite sides of the base film with the IC sandwiched in between;
    input signal lines and output signal lines wired between the IC and the input terminal and the output terminal, respectively;
    resin for resin sealing the IC; and
    a dummy pattern; wherein
    the dummy pattern is formed traversing an edge of the resin in a region not interfering with the input signal lines and the output signal lines, and thereby improving rigidity and elasticity of the edge portion of the resin and suppressing the formation of wrinkles.

2. The tape carrier according to claim 1, wherein the dummy pattern is formed on an outer side of a region where the input signal lines and the output signal lines are formed.

3. The tape carrier according to claim 1, wherein the dummy pattern is formed in a free region between the adjacent signal lines.

4. The tape carrier according to claim 2, wherein the dummy pattern is formed at both edges of a region where the input signal lines and the output signal lines are formed.

5. The tape carrier according to claim 2, wherein the dummy pattern is formed at both edges of a region where the input signal lines and the output signal lines are formed, and another dummy pattern is formed in a region which is sandwiched by the dummy patterns formed at both edges.

6. The tape carrier according to claim 1, wherein the dummy pattern is formed at a free region between the adjacent signal lines and at both edges of a region formed with the signal lines.

7. The tape carrier according to claim 4, wherein the dummy pattern is formed by arranging linear dummy patterns parallel to the input signal lines or the output signal lines.

8. The tape carrier according to claim 5, wherein the dummy pattern is a combination of a linear dummy pattern formed at both edges of a region where the input signal lines and the output signal lines are formed, being parallel to the input signal lines and the output signal lines, and a base shaped dummy pattern formed in a region sandwiched by the linear dummy patterns formed at both edges.

9. The tape carrier according to claim 6, wherein the dummy pattern is a combination of a linear or base shaped dummy pattern formed in a free region between the adjacent signal lines, and a linear dummy pattern formed at both edges of a region where the signal lines are formed, being parallel to the input signal lines or the output signal lines.

10. The tape carrier according to claim 1, wherein the dummy pattern includes a linear dummy pattern arranged to be parallel to and at a same interval as the input signal lines or the output signal lines.

11. The tape carrier according to claim 1, wherein the dummy pattern is electrically connected to a ground or a low potential terminal of the IC.

12. The tape carrier according to claim 1, wherein the input terminal is connected to a terminal of a circuit substrate for transmitting display drive information to a liquid crystal panel; and
    the output terminal is connected to a display electrode of the liquid crystal panel.

13. A liquid crystal display device comprising:
    a glass substrate including a liquid crystal panel and a liquid crystal panel electrode for panel drive;
    a circuit substrate for transmitting display information to the liquid crystal panel; and
    a tape carrier for electrically connecting the glass substrate and the circuit substrate; wherein
    the tape carrier includes,
        a base film mounted with an IC,
        an input terminal and an output terminal arranged on opposite sides of the base film with the IC in between, and electrically connected to a terminal of the glass substrate and a terminal of the circuit substrate,
        input signal lines and output signal lines wired between the IC and the input terminal and the output terminal, respectively,
        resin for resin sealing the IC, and
        a dummy pattern; and
    the dummy pattern is formed traversing the edge of the resin in a region not interfering with the input signal lines and the output signal lines, and thereby improving rigidity and elasticity of the edge portion of the resin and suppressing the formation of wrinkles.

* * * * *